(12) United States Patent
Lee et al.

(10) Patent No.: US 9,040,999 B2
(45) Date of Patent: May 26, 2015

(54) ORGANIC LIGHT EMITTING DISPLAY DEVICE

(71) Applicant: Samsung Display Co., Ltd., Yongin, Gyeonggi-Do (KR)

(72) Inventors: Yul-Kyu Lee, Yongin (KR); Kyu-Sik Cho, Yongin (KR); Sun Park, Yongin (KR); Ji-Hoon Song, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/050,503

(22) Filed: Oct. 10, 2013

(65) Prior Publication Data

US 2014/0353603 A1 Dec. 4, 2014

(30) Foreign Application Priority Data

May 29, 2013 (KR) .................. 10-2013-0061261

(51) Int. Cl.
*H01L 27/14* (2006.01)
*H01L 27/32* (2006.01)

(52) U.S. Cl.
CPC .................................. *H01L 27/3258* (2013.01)

(58) Field of Classification Search
None
See application file for complete search history.

(56) References Cited

U.S. PATENT DOCUMENTS

2012/0175605 A1 7/2012 Shin et al.
2013/0093654 A1 4/2013 Park et al.

FOREIGN PATENT DOCUMENTS

| KR | 10-2012-0043301 A | * | 5/2012 |
| KR | 1020120043301 A | | 5/2012 |
| KR | 1020120080855 A | | 7/2012 |
| KR | 1020130041575 A | | 4/2013 |

* cited by examiner

*Primary Examiner* — Bilkis Jahan
*Assistant Examiner* — Kevin Quinto
(74) *Attorney, Agent, or Firm* — Cantor Colburn LLP

(57) ABSTRACT

An organic light emitting display device includes an active layer of a transistor disposed on a substrate, a gate electrode disposed on the active layer and on a first insulation layer, a second insulation layer which is disposed on the gate electrode and exposes a source area and a drain area of the active layer, a drain electrode which is disposed on the second insulation layer and is connected to an exposed area of the drain area, a third insulation layer on the drain electrode, and a cathode electrode on the third insulation layer, where the cathode electrode penetrates the first insulation layer, the second insulation layer and the third insulation layer, and the cathode electrode is connected to an exposed area of the source area.

14 Claims, 4 Drawing Sheets

ORGANIC LIGHT EMITTING DISPLAY DEVICE

This application claims priority to Korean Patent Application No. 10-2013-0061261, filed on May 29, 2013, and all the benefits accruing therefrom under 35 U.S.C. §119, the disclosure of which is incorporated herein in its entirety by reference.

BACKGROUND

1. Field

The invention relates to an organic light emitting display device, and more particularly, to an organic light emitting display device which may improve an aperture ratio.

2. Description of the Related Art

An organic light emitting display device has superior characteristics in terms of a viewing angle, contrast, response speed and consumption power, for example, and thus an application range is being extended from personal portable devices such as MP3 players and mobile phones to a television ("TV").

Such an organic light emitting display device generally includes a plurality of pixels including one or more transistors and capacitors, and operation of the pixels may be divided into an initialization period, a compensation/data transfer period, and a scan/emission period.

Furthermore, in the initialization period, an initialization voltage is applied to an initialization transistor included in each pixel, and generally, the initialization voltage is supplied by an initialization voltage line which is separately formed in the pixel. Furthermore, a via hole is defined in each pixel for electrically connecting the initialization voltage line with the initialization transistor.

SUMMARY

The invention provides an organic light emitting display device which may improve an aperture ratio.

According to an exemplary embodiment of the invention, there is provided an organic light emitting display device including an active layer of a transistor disposed on a substrate, a gate electrode disposed on the active layer and on a first insulation layer, a second insulation layer that is disposed on the gate electrode and exposes a source area and a drain area of the active layer, a drain electrode that is disposed on the second insulation layer and is connected to an exposed area of the drain area, a third insulation layer on the drain electrode, and a cathode electrode on the third insulation layer, where the cathode electrode penetrates the first insulation layer, the second insulation layer and the third insulation layer, and the cathode electrode is connected to an exposed area of the source area.

The organic light emitting display device may further include a source electrode between the source area and the cathode electrode.

The transistor may be an initialization transistor.

The cathode electrode may apply an initialization voltage to the initialization transistor.

The initialization voltage may be a voltage applied to the cathode electrode.

The organic light emitting display device may further include an organic light emitting device including an anode electrode on the first insulation layer, an organic light emitting layer on the anode electrode, and the cathode electrode on the organic light emitting layer.

The organic light emitting display device may further include a capacitor including a lower electrode under the first insulation layer and an upper electrode on the first insulation layer, where the first insulation layer is a dielectric layer.

The organic light emitting display device may further include a buffer layer on the substrate.

The organic light emitting display device may further include a sealing member on the cathode electrode.

According to another aspect of the invention, there is provided an organic light emitting display device including an organic light emitting device ("OLED") including an anode electrode, a cathode electrode, and an organic light emitting layer disposed between the anode electrode and the cathode electrode, and a pixel circuit that supplies electric current to the OLED, where the pixel circuit includes an initialization transistor, where a source area of the initialization transistor is connected to the cathode electrode, and the cathode electrode applies an initialization voltage to the initialization transistor.

A first power voltage may be applied to the anode electrode, and a second power voltage may be applied to the cathode electrode, where the second power voltage is the initialization voltage and is applied to the initialization transistor.

The pixel circuit may further include a driving transistor, where a drain area of the initialization transistor is connected to a gate electrode of the driving transistor.

A second power voltage may be applied to the gate electrode of the driving transistor as a gate signal.

The initialization transistor may include an active layer disposed on a substrate, a gate electrode disposed on a first insulation layer that is disposed on an active layer, a drain electrode connected to a drain area of the active layer exposed by a contact hole of a second insulation layer that is disposed on the gate electrode, and a third insulation layer on the drain electrode, where the cathode electrode penetrates the first insulation layer, the second insulation layer and the third insulation layer.

The organic light emitting display device may further include a source electrode between the source area and the cathode.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
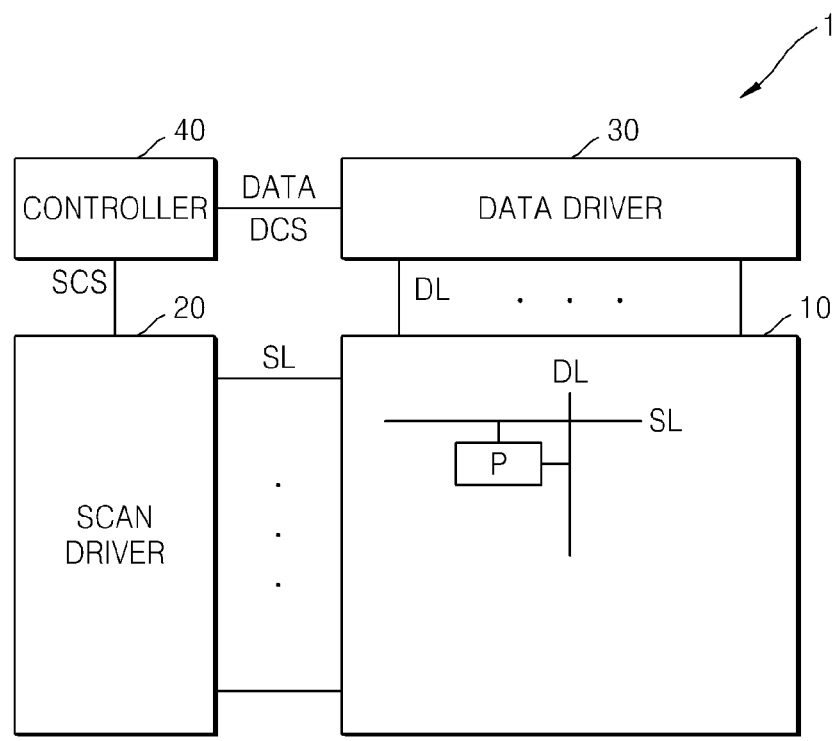
FIG. 1 is a block diagram schematically illustrating an organic light emitting display device according to an exemplary embodiment of the invention.

An initialization voltage line and a via hole respectively occupy a certain area. Therefore, when an initialization voltage is supplied by the initialization voltage line, a pixel opening is reduced according to the area where the initialization voltage line and the via hole are disposed.

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In the case where a position relationship between two items are described with the terms "on ~," "under ~," or the like, one or more items may be interposed therebetween unless a description is given using the term "directly".

FIG. 1 is a block diagram schematically illustrating an organic light emitting display device 1 according to an exemplary embodiment of the invention.

Referring to FIG. 1, the organic light emitting display device 1 may include a display panel 10 including a plurality of pixels P, a scan driver 20, a data driver 30 and a controller 40.

The scan driver 20, the data driver 30, and the controller 40 may be respectively disposed in a separate semiconductor chip, or may be integrated in one semiconductor chip. Furthermore, the scan driver 20 and the display panel 10 may be disposed on the same substrate.

A plurality of scan lines SL is horizontally disposed on the display panel 10, and a plurality of data lines DL, which perpendicularly crosses the scan lines SL, is vertically disposed on the display panel 10. A plurality of pixels P is disposed in a matrix form. In one exemplary embodiment, the pixels P may be in areas between intersections of the plurality of scan lines SL and the plurality of data lines DL, but the invention is not limited thereto.

Furthermore, though not illustrated in FIG. 1, various types of lines such as a plurality of light emitting control lines that supplies light emitting control signals, a driving voltage line that supplies a power voltage, for example, may be additionally disposed on the display panel 10.

Figure 3:
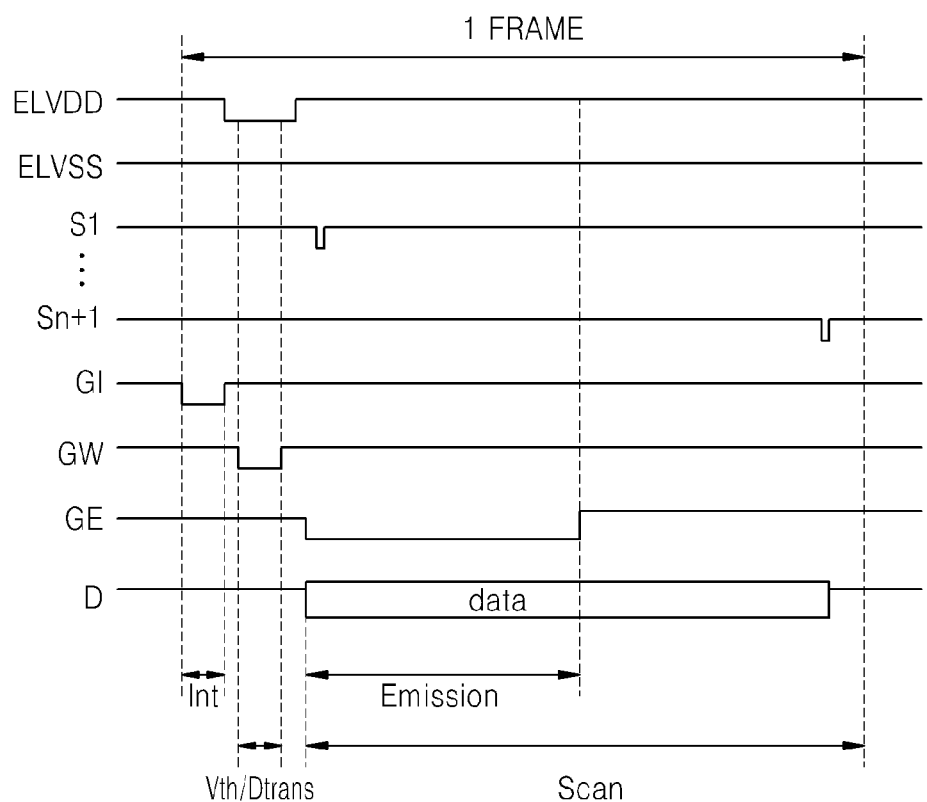
FIG. 3 is a timing diagram illustrating an operation of the pixel of FIG. 2.
Figure 4:
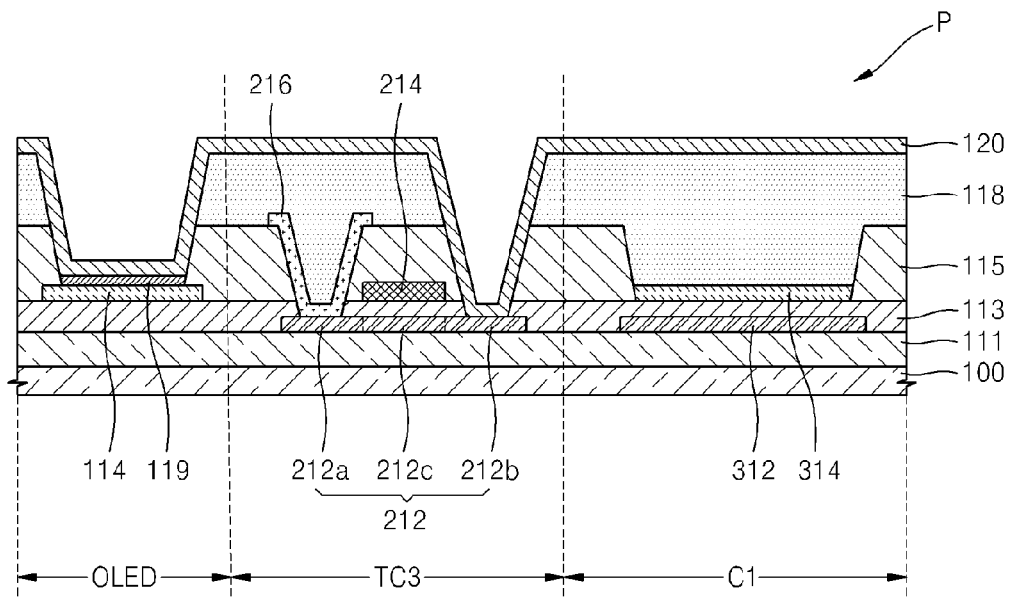
FIG. 4 is a diagram schematically illustrating some components of the organic light emitting display device of FIG. 1.

However, an initialization voltage line for supplying an initialization voltage Vint is not separately provided, and a second power voltage ELVSS may be supplied as the initialization voltage Vint by a cathode electrode (120 of FIG. 4). Hence, a formation of the initialization voltage line and a via hole for electrically connecting the initialization voltage line with an initialization transistor (TC3 of FIG. 2) may be omitted, and, as such, a space for widely designing a pixel opening may be provided, thereby improving an aperture ratio of the organic light emitting display device 1, which will be described in detail later with reference to FIGS. 2 to 4.

The scan driver 20 may generate scan signals and sequentially provide the generated scan signals to the display panel 10 through the plurality of scan lines SL.

The data driver 30 may sequentially provide data signals to the display panel 10 through the plurality of data lines DL. The data driver 30 converts input image data DATA having a grayscale input from the controller 40 into data signals in a form of a voltage or a current signal.

The controller 40 generates a scan control signal ("SCS") and a data control signal ("DCS"), and respectively transmits the SCS and the DCS to the scan driver 20 and the data driver 30. As such, the scan driver 20 sequentially applies scan signals for scan lines, and the data driver 30 applies data signals to respective pixels P. Furthermore, a first power voltage ELVDD, the second power voltage ELVSS, a light emitting control signal EM, for example, may be applied to respective pixels P under control of the controller 40.

Figure 2:
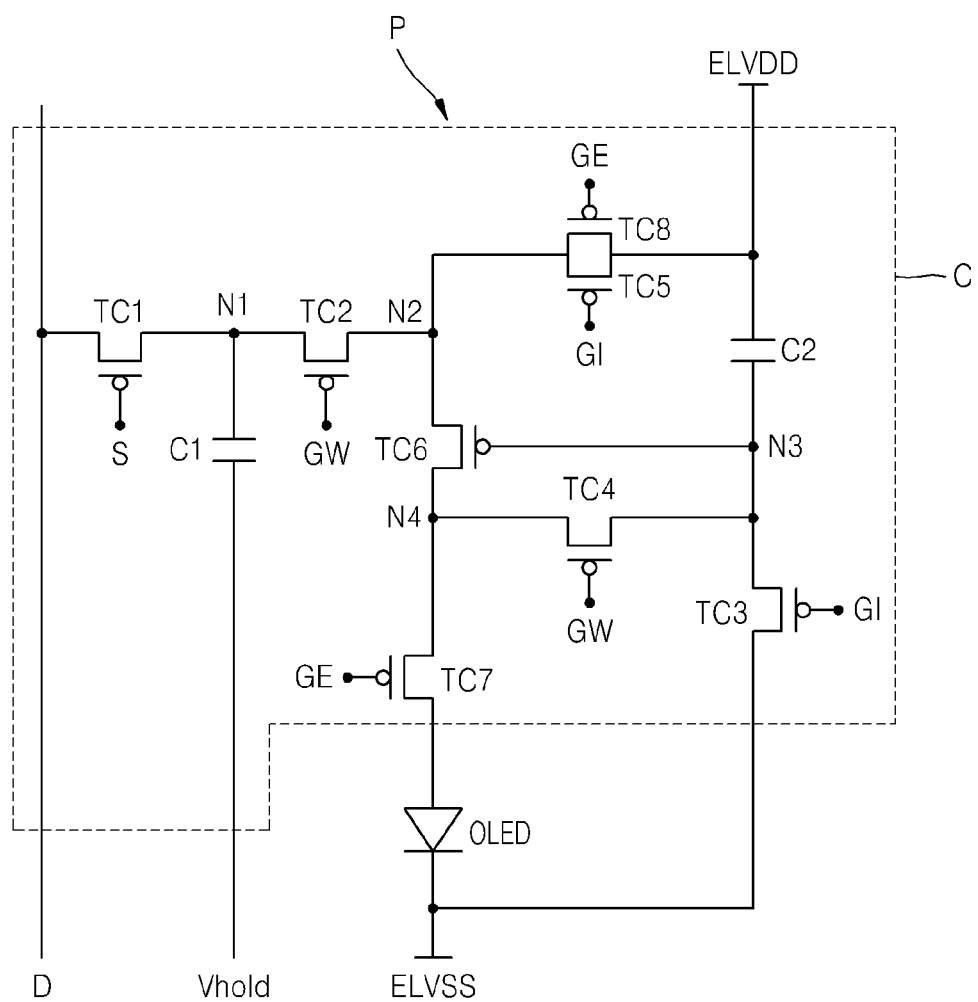
FIG. 2 is a circuit diagram of a pixel of the organic light emitting display device of FIG. 1.

FIG. 2 is a circuit diagram of a pixel P according to an exemplary embodiment of the invention, and FIG. 3 is a timing diagram illustrating an operation of the pixel P of FIG. 2.

Referring to FIG. 2, the pixel P includes an organic light emitting device ("OLED") and a pixel circuit C for supplying electric current to the OLED.

An anode electrode (114 of FIG. 4) of the OLED is connected to the pixel circuit C, and the cathode electrode (120 of FIG. 4) is connected to a second power source that supplies the second power voltage ELVSS. The OLED emits light at a predetermined luminance in response to the current supplied from the pixel circuit C.

In an exemplary embodiment, the pixel circuit C may include eight transistors TC1 to TC8 and two capacitors C1 and C2, for example.

Scan signals S may be applied to a gate electrode of the first transistor TC1 from scan lines, a first electrode of the first transistor TC1 may be connected to the data line and data signals D may be applied to the first electrode, and a second electrode of the first transistor TC1 may be connected to the first node N1.

A first control signal GW may be applied to a gate electrode of a second transistor TC2, a first electrode of the second transistor TC2 may be connected to the first node N1, and a second electrode of the second transistor TC2 may be connected to a second node N2.

A second control signal GI may be applied to a gate electrode of the third transistor TC3, a first electrode of the third transistor TC3 may be connected to the cathode electrode of the OLED, and the second power voltage ELVSS may be applied to the first electrode of the third transistor TC3 as the initialization voltage Vint, and a second electrode of the third transistor TC3 may be connected to the third node N3. That is, the third transistor TC3 operates as an initialization transistor.

The first control signal GW may be applied to a gate electrode of a fourth transistor TC4, a first electrode of the fourth transistor TC4 may be connected to the third node N3, and a second electrode of the fourth transistor TC4 may be connected to a fourth node N4.

The second control signal GI may be applied to the gate electrode of a fifth transistor TC5, a first electrode of the fifth transistor TC5 may be connected to a first power source that supplies the first power voltage ELVDD and the first power voltage ELVDD may be applied to the first electrode of the fifth transistor TC5, and a second electrode of the fifth transistor TC5 may be connected to the second node N2.

A gate electrode of a sixth transistor TC6 may be connected to the third node N3, a first electrode of the sixth transistor TC6 may be connected to the second node N2 and a second electrode of the sixth transistor TC6 may be connected to the fourth node N4. The sixth transistor TC6 may operate as a driving transistor, and the second power voltage ELVSS may be applied to the gate electrode of the sixth transistor TC6 as a gate signal.

A third control signal GE may be applied to a gate electrode of a seventh transistor TC7, a first electrode of the seventh transistor TC7 may be connected to fourth node N4, and a second electrode of the seventh transistor TC7 may be connected to the anode electrode (114 of FIG. 4) of the OLED.

The third control signal GE may be applied to a gate electrode of a eighth transistor TC8, a first electrode of the eighth transistor TC8 may be connected to the first power source that supplies the first power voltage ELVDD and the first power voltage ELVDD may be applied to the first electrode of the eighth transistor TC8, and a second electrode of the eighth transistor TC8 may be connected to the second node N2.

A first capacitor C1 may be connected between the first node N1 and a third power source that supplies a third power voltage Vhold. When the first transistor TC1 is turned on, the first capacitor C1 charges a voltage corresponding to the data signal D supplied from the data line. The third power source may be a fixed power source (e.g., DC power source) having a predetermined voltage. In an exemplary embodiment, the third power source may be the same as the first power source that supplies the first power voltage ELVDD, for example, but the invention is not limited thereto. A second capacitor C2 may be connected between the third node N3 and the first power source.

Referring to FIG. 3, each pixel P operates in a simultaneous light-emitting scheme, and the operation may be divided into an initialization period (Int), a compensation/data transfer period (Vth/Dtrans), and a scan/emission period (Scan/Emission). In the scan/emission period (Scan/Emission), scan signals are sequentially input to respective scan lines, and in response thereto, data signals are sequentially input to respective pixels P. Initialization and threshold voltage compensation of a driving transistor included in respective pixels P, data transfer, and light-emitting operation of respective pixels P may be simultaneously implemented for respective frames.

In the initialization period (Int), the first power voltage ELVDD is applied at a high level, and the second power voltage ELVSS and the second control signal GI are applied at a low level. As such, the third transistor TC3 and the fifth transistor TC5 are turned on, and the first power voltage ELVDD is applied to the second node N2, and the initialization voltage Vint is applied to the third node N3.

Furthermore, according to the exemplary embodiment of the invention, the initialization voltage line for supplying the initialization voltage Vint may not be separately provided, the cathode electrode (120 of FIG. 4) may be connected to the third transistor TC3 and the second power voltage ELVSS may be applied to the third node N3 as the initialization voltage Vint.

Both the initialization voltage Vint and the second power voltage ELVSS may be set as a ground voltage, and the initialization voltage Vint may be substituted by the second power voltage ELVSS. Hence, an initialization voltage line may be removed and the pixel opening may be designed to be as wide as an area of the removed initialization voltage line, and thus an aperture ratio of the organic light emitting display device 1 may be effectively improved.

In the compensation/data transfer period Vth/Dtrans, the first power voltage ELVDD, the second power voltage ELVSS and the first control signal GW are applied at a low level. As such, the second transistor TC2 is turned on, and the data signals D written in the pixels in a scan period of N−1 frames which have been stored in the first capacitor C1 are transferred to the second node N2. Furthermore, the fourth transistor TC4 is turned on and the sixth transistor TC6 is diode-connected, electric current flows through the diode-connected sixth transistor TC6, and a threshold voltage of the sixth transistor TC6 is compensated and the voltage difference between the first power voltage ELVDD and the second node N2 is stored in the second capacitor C2.

In the scan/emission period (Scan/Emission), the scan period and the emission period are simultaneously performed. In the scan/emission period (Scan/Emission), the first power voltage ELVDD is applied at a high level, and the second power voltage ELVSS and the third control signal GE are applied at a low level. Furthermore, the scan signals (S1 to Sn+1) of low level are sequentially input to respective scan lines, and the first transistor TC1 is turned on and data signals of N frames are sequentially input to pixels P connected to respective scan lines.

Furthermore, the second transistor TC2 is turned off to block the first node N1 and the second node N2. Also, the seventh and eighth transistors TC7 and TC8 are turned on and thus a current path from the first power voltage ELVDD to the cathode of the OLED is formed via the turned-on fifth transistor TC5, the turned-on sixth transistor TC6 and the turned-on seventh transistor TC7, and the OLED emits light to a brightness corresponding to a data signal written in the emission pixel P in the scan period of a (N−1)th frame stored in the second capacitor C2. At this time, all pixels P sequentially emit light. That is, in the scan/emission period (Scan/Emission), data signals of the Nth frame are sequentially input according to scan signals and, at the same time, each emission pixel P emits light in correspondence with data signals of the (N−1)th frame. Furthermore, the emission period (Emission) may be partially overlapped with the scan period, and may be performed for a shorter period of time than the scan period (Scan).

Here, a width of the sequentially applied scan signals S1 to Sn+1 may be applied as two horizontal hours (2H), and widths of the adjacent scan signals, for example, a width of the (n−1)th scan signal (Sn−1) and a width of the nth scan signal (Sn) may be applied to be overlapped by less than one horizontal hour (1H). This is to overcome an insufficient charge situation according to an RC delay of the signal lines due to a large size of a display area of the OLED device.

Figure 5:
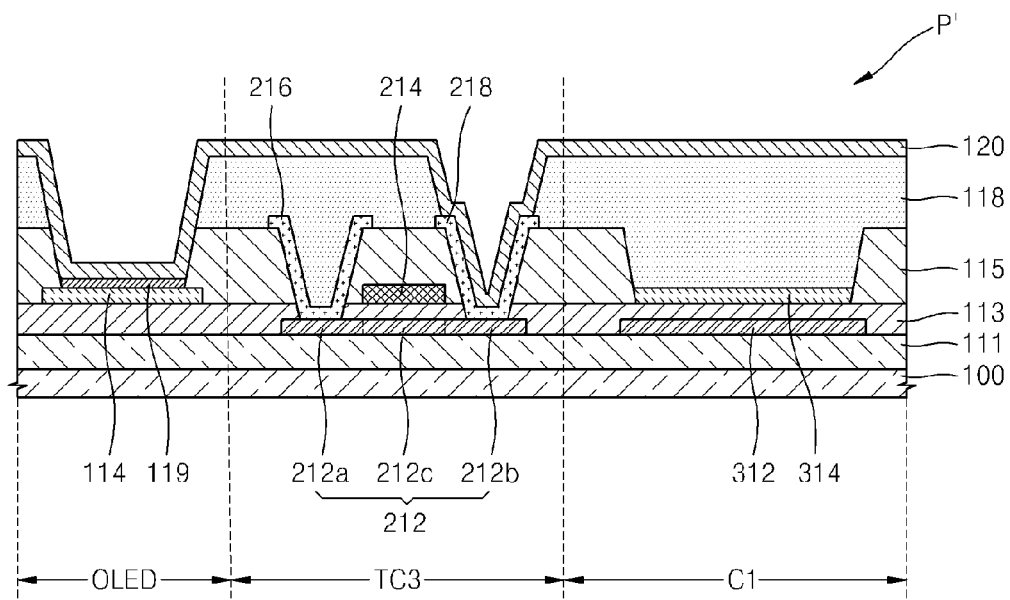
FIG. 5 is a diagram schematically illustrating a modified example of the organic light emitting display device of FIG. 4.

FIG. 4 is a diagram schematically illustrating components of the organic light emitting display device 1, and FIG. 5 is a diagram schematically illustrating a modified example P' of pixels P of the organic light emitting display device of FIG. 4.

As described above with regard to FIG. 2, each pixel P includes eight transistors TC1 to TC8, two capacitors C1 and C2, scan lines SL, data lines DL, for example, but only the OLED, the third transistor TC3, and the first capacitor C1 are illustrated in FIGS. 4 and 5, and the components thereof will be described in detail.

First, a substrate 100 may include transparent glass including $SiO_2$. However, in an exemplary embodiment, the substrate 100 may include transparent plastic.

A buffer layer 111 may be disposed on the substrate 100. The buffer layer 111 provides a substantially flat plane on an upper part of the substrate 100 and effectively prevents infiltration of moisture and alien substances.

The third transistor TC3 may include an active layer 212, a gate electrode 214, and a drain electrode 216.

Specifically, the active layer 212 of the third transistor TC3 is disposed on the buffer layer 111. The active layer 212 may include an inorganic semiconductor material such as amorphous silicon and polysilicon, for example. Furthermore, the active layer 212 may include an organic semiconductor material, an oxide semiconductor material or other various materials. The active layer 212 includes a source area 212b and a drain area 212a provided by doping of impurities, and a channel area 212c between the source area 212b and the drain area 212a.

A gate electrode 214 is disposed on the active layer 212 at a position corresponding to the channel area 212c of the active layer 212 while a first insulation layer 113 is disposed between the gate electrode 214 and the active layer 212. The second control signal (GI FIG. 2) is applied to the gate electrode 214.

A second insulation layer 115 that is an inter-metal dielectric layer is disposed on the gate electrode 214. A contact hole is defined in the second insulation layer 115 and exposes the drain area 212a and the source area 212b of the active layer 212.

The drain electrode 216 connected to the drain area 212a of the active layer 212 exposed by the contact hole is disposed on the second insulation layer 115, and a third insulation layer 118 is disposed on the drain electrode 216. The third insulation layer 118 may be provided as an organic insulation layer.

A via hole is defined in the first insulation layer 113, the second insulation layer 115 and the third insulation layer 118, and the cathode electrode 120 is connected to the source area 212b through the via hole.

That is, the cathode electrode 120 may penetrate the first insulation layer 113, the second insulation layer 115, and the third insulation layer 118 to directly contact the source area 212b of the active layer 212. As described above with regard to FIG. 2, the cathode electrode 120 is connected to the second power source that supplies the second power voltage ELVSS, and thus the second power voltage ELVSS may be applied to the third transistor TC3, which is the initialization transistor, as the initialization voltage Vint.

However, the invention is not limited thereto, and the source electrode 218 connected to the source area 212b may be further included in the third transistor TC3 as illustrated in FIG. 5. Here, the cathode electrode 120 is electrically connected to the source electrode 218 through the via hole.

Likewise, when the initialization voltage Vint is applied by the cathode electrode 120, the initialization voltage line for supplying the initialization voltage Vint may not be separately configured. That is, the pixel opening may be designed to be as wide as the area where the initialization voltage line is to be arranged. Generally, the initialization voltage line is longitudinally disposed along one side direction of the pixel P and a width of the initialization voltage line is about 20 micrometers (μm). Hence, when the initialization voltage line is removed, the aperture ratio of the organic light emitting display device 1 may be increased by about 7 to 8 percent (%).

The OLED may include the anode electrode 114, an organic light emitting layer 119, and the cathode electrode 120.

Specifically, the anode electrode 114 may be disposed on the buffer layer 111 and the first insulation layer 113. The anode electrode 114 may include transparent conductive materials which are the same as the gate electrode 214. The transparent conductive materials may include at least one selected from indium tin oxide ("ITO"), indium zinc oxide ("IZO"), indium gallium oxide ("IGO"), aluminum zinc oxide ("AZO"). The anode electrode 114 is connected to the pixel circuit (C of FIG. 2).

The organic light emitting layer 119 may be disposed on the anode electrode 114, and light emitted from the organic light emitting layer 119 may be emitted toward the substrate 100 through the anode electrode 114.

The organic light emitting layer 119 may include low molecular organic matter or high molecular organic matter. When the organic light emitting layer 119 includes low molecular organic matter, a hole transport layer ("HTL"), a hole injection layer ("HIL"), an electron transport layer ("ETL"), an electron injection layer ("EIL"), for example, may be stacked. In addition, various other layers may also be stacked as necessary. Here, exemplary embodiments of organic matter include copper phthalocyanine ("CuPc"), N'-Di(naphthalene-1-yl)-N, N'-diphenyl-benzidine ("NPB"), tris-8-hydroxyquinoline aluminum (Alq3), for example.

Furthermore, when the organic light emitting layer 119 includes high molecular organic matter, the HTL may be included in addition to the organic light emitting layer 119. The HTL may use poly-(3,4)-ethylene-dihydroxy thiophene ("PEDOT"), polyaniline ("PANI"), etc. At this time, exemplary embodiments of usable organic matter include high molecular organic matter such as Poly-Phenylenevinylene ("PPV") and Polyfluorene based matter.

The cathode electrode 120 is disposed on the organic light emitting layer 119 as a common electrode, and the cathode electrode 120 is connected to the second power source, which supplies the second power voltage ELVSS.

The cathode electrode 120 may include a reflective electrode. Here, the cathode electrode 120 may contain at least one selected from Al, Mg, Li, Ca, LiF/Ca, LiF/Al, and combination thereof.

The cathode electrode 120 is provided as a reflective electrode, and thus light emitted from the organic light emitting layer 119 is reflected in the cathode electrode 120 and penetrates the anode electrode 114 including transparent conductive materials so as to be emitted toward the substrate 100.

The first capacitor C1 may include a lower electrode 312 and an upper electrode 314 that are respectively disposed on and under the first insulation layer 113 where the first insulation layer 113 is the dielectric layer.

Specifically, the lower electrode 312 of the first capacitor C1 includes the same materials as those of the active layer 212, and is disposed on the substrate 100 and the buffer layer 111. The upper electrode 314 of the first capacitor C1 includes the same materials as those of the anode electrode 114 and is disposed on the first insulation layer 113.

Furthermore, though not illustrated in FIGS. 4 and 5, a sealing member (not shown) may be disposed on an upper part of the cathode electrode 120. The sealing member (not shown) is disposed to protect the organic light emitting layer 119 from external moisture or oxygen, for example, and may include glass or plastic or may have a structure in which a plurality of organic layers and inorganic layers are stacked.

According to an exemplary embodiment of the invention, a space for widely designing a pixel opening may be provided by removing an initialization voltage line, thereby improving an aperture ratio of an organic light emitting display device.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic light emitting display device comprising:
    an active layer of a transistor disposed on a substrate;
    a gate electrode disposed on the active layer and on a first insulation layer;
    a second insulation layer which is disposed on the gate electrode and exposes a source area and a drain area of the active layer;
    a drain electrode which is disposed on the second insulation layer and is connected to an exposed area of the drain area;
    a third insulation layer on the drain electrode; and
    a cathode electrode on the third insulation layer,
    wherein the cathode electrode penetrates the first insulation layer, the second insulation layer and the third insulation layer, and the cathode electrode is connected to an exposed area of the source area.

2. The organic light emitting display device of claim 1, further comprising:
    a source electrode between the source area and the cathode electrode.

3. The organic light emitting display device of claim 1, further comprising:
    an organic light emitting device including an anode electrode on the first insulation layer;
    an organic light emitting layer on the anode electrode; and
    the cathode electrode on the organic light emitting layer.

4. The organic light emitting display device of claim 1, further comprising:
    a capacitor including a lower electrode under the first insulation layer and an upper electrode on the first insulation layer, wherein the first insulation layer is a dielectric layer.

5. The organic light emitting display device of claim 1, further comprising:
    a buffer layer on the substrate.

6. The organic light emitting display device of claim 1, further comprising:
    a sealing member on the cathode electrode.

7. The organic light emitting display device of claim 1, wherein the transistor is an initialization transistor.

8. The organic light emitting display device of claim 7, wherein the cathode electrode applies an initialization voltage to the initialization transistor.

9. The organic light emitting display device of claim 8, wherein the initialization voltage is a voltage applied to the cathode electrode.

10. An organic light emitting display device comprising:
    an organic light emitting device including an anode electrode, a cathode electrode, and an organic light emitting layer disposed between the anode electrode and the cathode electrode; and
    a pixel circuit which supplies electric current to the organic light emitting device
    and includes an initialization transistor comprising:
        a substrate;
        an active layer disposed on the substrate;
        a first insulation layer on the active layer;
        a gate electrode disposed on the first insulation layer;
        a second insulation layer on the active layer;
        a drain electrode connected to a drain area of the active layer exposed by a contact hole of a second insulation layer, and
        a third insulation layer on the drain electrode,
    wherein a source area of the initialization transistor is connected to the cathode electrode,
    wherein the cathode electrode applies an initialization voltage to the initialization transistor, and
    wherein the cathode electrode penetrates the first insulation layer, the second insulation layer and the third insulation layer.

11. The organic light emitting display device of claim 10, wherein a first power voltage is applied to the anode electrode, and a second power voltage is applied to the cathode electrode,
    wherein the second power voltage is the initialization voltage and is applied to the initialization transistor.

12. The organic light emitting display device of claim 11, further comprising:
    a source electrode between the source area and the cathode.

13. The organic light emitting display device of claim 10, wherein the pixel circuit further comprises a driving transistor,
    wherein a drain area of the initialization transistor is connected to a gate electrode of the driving transistor.

14. The organic light emitting display device of claim 13, wherein a second power voltage is applied to the gate electrode of the driving transistor as a gate signal.

* * * * *